United States Patent [19]

Cummings et al.

[11] Patent Number: 5,378,949
[45] Date of Patent: Jan. 3, 1995

[54] SIGNAL MIXING DEVICE UTILIZING A SUPERCONDUCTING STRIP LINE WITH SUPERCONDUCTING WEAK LINKS AND TWO CONTROL LINES

[75] Inventors: Michael Cummings, Howell; Roland Cadotte, Jr., Freehold, both of N.J.; Adam Rachlin, Germantown, Md.; Richard W. Babbitt, Fair Haven, N.J.

[73] Assignee: The United States of America as represented by the Secretary of the Army, Washington, D.C.

[21] Appl. No.: 69,051

[22] Filed: May 25, 1993

[51] Int. Cl.$^6$ .................................. H03B 19/00
[52] U.S. Cl. .............................. 327/113; 327/527
[58] Field of Search ........... 307/245, 306, 303, 303.1, 307/529, 277, 541; 257/34; 505/856, 857, 863, 864, 865; 333/995

[56] References Cited

U.S. PATENT DOCUMENTS 5,229,655  7/1994  Martens et al. ............... 307/541

OTHER PUBLICATIONS

J. S. Martens, "The Models and Applications of a High Frequency Three Terminal Device Made of High Temperature Superconductors," Ph.D. Thesis, University of Wisconsin, Madison, 1990, pp. 254–259.
J. S. Martens et al, "S-Parameter Measurements and Applications of Superconducting Flux Flow Transistors", IEEE MTT-S Digest, pp. 1231–1234, 1991.
R. S. Pengelly, "Microwave Field Effect Transistors—Theory, Design and Applications", Research Studies Press, pp. 233–236, 1982.
J. H. Hinken, Superconductor Electronics, Springer-Verlag, 1989, pp. 4–12.

*Primary Examiner*—William L. Sikes
*Assistant Examiner*—James Dudek
*Attorney, Agent, or Firm*—Michael Zelenka; William H. Anderson

[57] ABSTRACT

The present invention is a superconducting flux flow mixer which has two control lines. Preferably, the mixer comprises a grounded superconducting signal line wherein portions of the superconducting signal line are etched away to form superconducting weak links within the superconducting signal line, a local oscillator and RF control line disposed on either side of the superconducting weak links, and a substrate upon which the control lines and superconducting signal line are disposed. When cooled to a temperature close to the critical temperature of the superconducting weak links, the resistance of the weak links can be manipulated by a magnetic field created by current flowing through the local oscillator and RF control lines. By using two control lines, better control of frequency is attained while at the same time providing better stability and a decrease in size of prior art mixers.

5 Claims, 1 Drawing Sheet

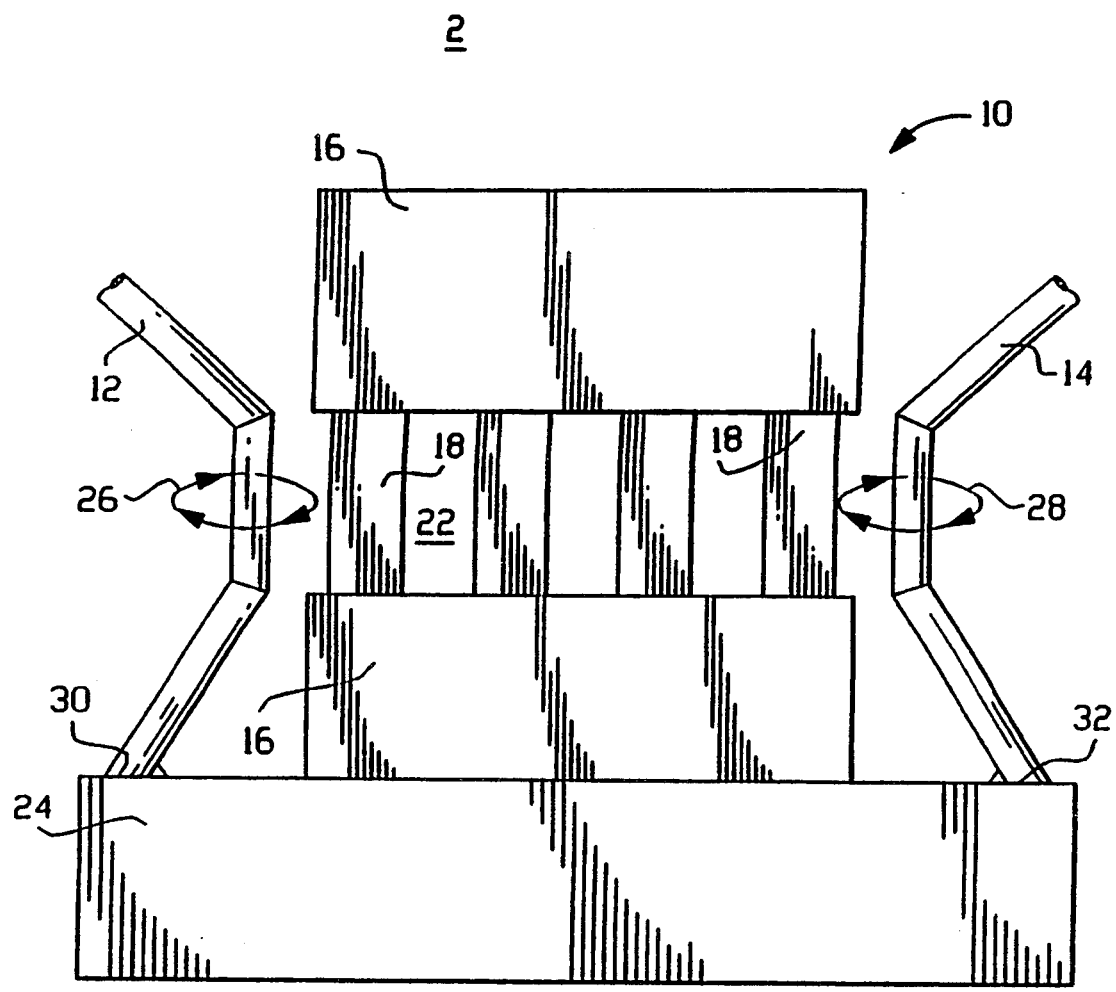

SIGNAL MIXING DEVICE UTILIZING A SUPERCONDUCTING STRIP LINE WITH SUPERCONDUCTING WEAK LINKS AND TWO CONTROL LINES

GOVERNMENT INTEREST

The invention described herein may be manufactured, used, sold and licensed by or for the government of the United States of America without the payment to us of any royalty thereon.

FIELD OF THE INVENTION

The present invention relates in general to superconducting microelectronic devices and more particularly to superconducting flux flow mixers.

BACKGROUND OF THE INVENTION

Examples of prior art superconducting mixers are described in publications such as J.S. Martens, "The Models and Applications of a High Frequency Three Terminal Device Made of High Temperature Superconductors," Ph.D. Thesis, University of Wisconsin, Madison, 1990, pgs. 254-259 and J.S. Martens et at, S-Parameter Measurements and Applications of Superconducting Flux Flow Transistors," IEEE MTT-S Digest, pgs. 1231-1234. The prior art mixers generally may be described as a mixer which includes two flux flow transistors in a cascode configuration which has a feed back between input and outputs ports. This prior art mixer, however, is relatively large in size, is relatively unstable and is likely to oscillate because of its feed back path.

Other related prior art publications include R.S. Pengelly, "Microwave Field Effect Transistors—Theory, Design and Applications," Research Studies Press, 1982, Pgs. 233-236 and J.H. Hinken, *Superconductor Electronics*, Springer-Veriag, 1989, pgs. 4-12.

SUMMARY OF THE INVENTION

Accordingly, one object of the present invention is to provide a superconducting flux flow mixer which provides greater control over varying frequency bands, but which is stable and minimized in size.

This and other objects of the present invention are accomplished by a superconducting flux flow mixer which has two control lines. Preferably, the mixer comprises a grounded superconducting signal line wherein portions of the superconducting signal line are etched away to form superconducting weak links within the superconducting signal line, a local oscillator and RF control line disposed on either side of the superconducting weak links, and a substrate upon which the control lines and superconducting signal line are disposed. When cooled to a temperature close to the critical temperature of the superconducting weak links, the resistance of the weak links can be manipulated by a magnetic field created by current flowing through the local oscillator and RF control lines. By using two control lines, better control of frequency is attained while at the same time providing better stability and a decrease in size as compared to prior art superconducting flux flow mixers.

BRIEF DESCRIPTION OF THE DRAWINGS

These and other features of the invention will become apparent in light of the Detailed Description of the Invention and the Figure wherein:

The Figure is a top view of a superconducting flux flow mixer according to the present invention.

Some of the elements of the Figure have not been drawn to scale for purposes of illustrating the invention. Typical dimensions for the invention are given in the Detailed Description of the Invention.

DETAILED DESCRIPTION OF THE INVENTION

Now referring to the Figure, there is shown a superconducting flux flow mixer 10 according to the present invention. As shown, a superconducting signal line 16 is disposed on a substrate (depicted as the numeral 2). Preferably, the high temperature superconducting material used in the present invention is a specie of $YBa_2Cu_3O_{7-x}$ (YBCO) and the substrate 2 is formed of $LaAlCO_3$ and is typically on the order of 20 mils thick. The YBCO may be deposited on the substrate using processes known in the art. Typically, two such processes that are used include: an ex-situ process in which Y, Ba, and Cu are deposited with the correct stoichiometry by coevaporation of $BaF_2$, Y and Cu followed by a post deposition annealing, typically at 850° C., in flowing $O_2$ containing water vapor; and an in-situ growth process using off-axis single target sputtering with temperatures typically between 650° and 750° C. As those skilled in the art will readily recognize other superconducting materials and substrates may also be utilized for this invention. Examples of some other high temperature superconducting materials include $Tl_2Ba_2Ca_2Cu_3O_x$, $Bi_{2-x}Pb_xSr_2Ca_2Cu_3O_{10+y}$, and $Li_xBi_2Sr_2CaCu_2O_{8+y}$ and other substrate materials include $SrTiO_3$ as well as various other metallic substrates.

As shown, superconducting weak links 18 are then etched in the superconducting signal line 16 as depicted. The patterning of the superconducting weak links 18 may be accomplished with standard photoresists and known masking techniques. A spray etch may also be used to prevent the formation of a residual film typically found with most other wet etch methods. An example of the dimensions of the patterning of the weak links 18 would 3×10 microns for the width and length of material to be etched completely down to the substrate (depicted as numeral 22) and the thickness of the existing superconducting material in the weak link region would be reduced to approximately 100 nanometers. This thinning of the weak links 18 permits operation of the invention in a critical current mode. As shown, there preferably are four such weak links 18 across the width of the superconducting signal line 16. An example width of the signal line 16 would be 1 mil.

Local oscillator and RF control lines 14 and 12, respectively, are then fabricated on either side of the superconducting weak link region. The control lines 12 and 14 are positioned adjacent and close enough to the superconducting weak link region such that when current passes through the control lines 12 and 14, the induced magnetic field (depicted by arrows 28 and 26) passes through the weak link region. Also as shown, the control lines 12 and 14 and the superconducting signal line 16 are grounded to the ground plane 24 at connections 30 and 32.

In operation, the superconducting flux flow mixer is cooled to the temperature of liquid nitrogen so as to make the superconducting signal line superconducting. As RF current passes through the RF control line 12 to the ground plane 24, a magnetic field, the polarity of which is indicated by arrows 26, is established. Likewise, when current, either DC or RF, is passed through the local oscillator control line 14 another magnetic field is established that biases the device into the nonlinear region of operation. Because the weak links 18 have been patterned and thinned to operate in the critical current mode while the rest of superconducting signal line remains superconducting, the magnetic field produced by the control lines 12 and 14 will alter the resistance of the weak links 18. As those skilled in the art will readily appreciate, the magnitude of the resistance will depend upon the magnitude of the magnetic field permeating the weak link as well as the grain size and/or composition of the superconducting material used. The relation between resistance and magnetic field is disclosed in such articles as "The Universal Magnetic Field Dependence of the Critical Current Density in High-$T_c$ Ceramics," by Fisher et al; and "Properties of Critical Current Density in Heterostructures of $Y_1Ba_2Cu_3O_{7-y}/Y_1Ba_2(Cu_{1-x}Ni_x)_3O_{7-y}$ Superconducting Films, both in AIP Conference Proceedings 251, Superconductivity and Its Applications, American Institute of Physics, 1992, incorporated herein by reference. Briefly though, the local critical current density will be directly effected by changes in the magnitude of a magnetic field in which superconducting material is immersed. This direct change is not a linear relationship, however, but rather varies as the relationship, $B^{-3/2}$, wherein in B is equal to the magnetic field. By controlling the resistance of the superconducting weak links 18, the output power of the superconducting signal line 16 may also be controlled. Therefore, if the weak links 18 are biased in a nonlinear mode, by either DC (from the local oscillator control line) or RF excitation, the weak links will mix the LO and RF signals carried by the two lines 12 and 14.

Advantages of the present invention include:
A. A second control line 14 is used in a standard flux flow transistor in order to provide mixing.
B. The relatively large size of the prior art mixer is reduced by more than half.
C. The problems of the prior mixer, of being relatively unstable and being likely to oscillate because of its feedback path, are avoided.

While the invention has been described in its preferred embodiment, it is to be understood that the words which have been used are words of description rather than limitation and that changes may be made within the purview of the appended claims with out departing from the true scope and spirit of the invention in its broader aspects.

What is claimed is:

1. A superconducting flux flow mixer comprising:
   a substrate;
   a superconducting signal line formed on the substrate with a weak link region etched therein, the weak link region extending laterally across the superconducting signal line and having at least a first and second opposite sides;
   an RF control line formed on the substrate and disposed adjacent the first side of the weak link region;
   a local oscillator control line formed on the substrate and disposed adjacent the second opposite side of the superconducting weak link region; and
   a ground which is electrically connected to the superconducting signal line, the RF control line and the local oscillator control line;
   wherein electrical current flowing through the RF and local oscillator control lines establishes a magnetic field across the superconducting weak link region such that changes in the magnetic field alters the resistance of the superconducting weak link region, thereby controlling the mix of signals being carried by the RF and local oscillator control lines.

2. The superconducting flux flow mixer according to claim 1 wherein the substrate is made of $LaAlO_3$.

3. The superconducting flux flow mixer according to claim 2 wherein the superconducting signal line is made of a material which is a specie of yttrium barium cuprate $YBa_{22}Cu_3O_{7-x}$ (YBCO).

4. The superconducting flux flow mixer according to claim 3 wherein the weak link region is biased in a nonlinear mode.

5. The superconducting flux flow mixer according to claim 4 wherein the weak link region is comprised of a plurality of alternating spaces and weak links wherein the dimensions of the spaces and weak links are approximately 3 microns in width and 10 microns in length and wherein the thicknesses of the weak links are about 100 nanometers.

* * * * *